United States Patent
Toriumi et al.

(10) Patent No.: US 9,503,108 B2
(45) Date of Patent: Nov. 22, 2016

(54) OSCILLATION CIRCUIT, OSCILLATOR, ELECTRONIC DEVICE, AND MOVING OBJECT

(71) Applicant: Seiko Epson Corporation, Tokyo (JP)

(72) Inventors: Yuichi Toriumi, Fujimi (JP); Nobutaka Shiozaki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/514,816

(22) Filed: Oct. 15, 2014

(65) Prior Publication Data

US 2015/0102860 A1    Apr. 16, 2015

(30) Foreign Application Priority Data

Oct. 16, 2013  (JP) ................................. 2013-215623

(51) Int. Cl.
*H03L 7/197* (2006.01)
*H03L 7/10* (2006.01)

(52) U.S. Cl.
CPC ............... *H03L 7/197* (2013.01); *H03L 7/104* (2013.01); *H03L 7/1974* (2013.01)

(58) Field of Classification Search
CPC ........... H03L 7/08; H03L 7/104; H03L 7/18; H03L 7/197; H03L 7/1974
USPC .......... 327/147, 156; 331/10, 16, 34, 177 R; 375/373, 376
See application file for complete search history.

(56) References Cited

U.S. PATENT DOCUMENTS

| | | | |
|---|---|---|---|
| 4,677,394 A * | 6/1987 | Vollmer | 331/1 A |
| 5,142,247 A * | 8/1992 | Lada, Jr. et al. | 331/14 |
| 5,656,975 A * | 8/1997 | Imura | 331/11 |
| 5,748,047 A * | 5/1998 | Guthrie et al. | 331/19 |
| 5,834,987 A * | 11/1998 | Dent | 332/127 |
| 6,081,164 A * | 6/2000 | Shigemori et al. | 331/16 |
| 6,211,747 B1* | 4/2001 | Trichet et al. | 332/128 |
| 6,292,507 B1* | 9/2001 | Hardin et al. | 375/130 |
| 7,508,897 B2 | 3/2009 | Yoneu | |
| 7,755,527 B2 | 7/2010 | Lee et al. | |
| 8,674,780 B2 | 3/2014 | Akaike et al. | |

(Continued)

FOREIGN PATENT DOCUMENTS

| | | |
|---|---|---|
| JP | 05-284021 A | 10/1993 |
| JP | 2003-158453 A | 5/2003 |

(Continued)

*Primary Examiner* — Levi Gannon
(74) *Attorney, Agent, or Firm* — Harness, Dickey & Pierce, P.L.C.

(57) ABSTRACT

An oscillation circuit, an oscillator, an electronic device, and a moving object which are capable of adjusting an output frequency in a high modulation bandwidth with a high level of accuracy and adjusting a timing at which the output frequency is changed are provided. The oscillation circuit generates an oscillation signal by oscillating an oscillation element and includes a communication unit that receives frequency setting data for setting a frequency of the oscillation signal and frequency change data which is given a timing at which the frequency of the oscillation signal is changed on the basis of the frequency setting data, by serial transfer, and registers in which the frequency setting data and the frequency change data received by the communication unit are stored, respectively. An address of the register storing the frequency setting data is continuous with an address of the register storing the frequency change data.

6 Claims, 18 Drawing Sheets

(56) References Cited

U.S. PATENT DOCUMENTS

2010/0171532 A1* 7/2010 Tajima et al. .................. 327/142
2013/0106523 A1* 5/2013 Akaike et al. .................. 331/44

FOREIGN PATENT DOCUMENTS

| JP | 2006-005489 A | 1/2006 |
| JP | 2013-098872 A | 5/2013 |

* cited by examiner

| ADDRESS | REGISTER NAME | bit7 | bit6 | bit5 | bit4 | bit3 | bit2 | bit1 | bit0 |
|---|---|---|---|---|---|---|---|---|---|
| 10 | Freq00 | - | - | - | - | \multicolumn{4}{c|}{U_ODIV[3:0]} | | | |
| 11 | Freq01 | - | - | \multicolumn{6}{c|}{U_N$_{INT}$[5:0]} | | | | | |
| 12 | Freq02 | \multicolumn{8}{c|}{U_N$_{FRAC}$[23:16]} | | | | | | | |
| 13 | Freq03 | \multicolumn{8}{c|}{U_N$_{FRAC}$[15:8]} | | | | | | | |
| 14 | Freq04 | \multicolumn{8}{c|}{U_N$_{FRAC}$[7:0]} | | | | | | | |
| 15 | SysCtrl | - | - | - | - | - | NEWF | - | - |

FIG. 2

| ADDRESS | REGISTER NAME | bit7 | bit6 | bit5 | bit4 | bit3 | bit2 | bit1 | bit0 |
|---|---|---|---|---|---|---|---|---|---|
| 10 | Freq00 | – | – | – | – | \multicolumn{4}{c}{U_ODIV[3:0]} | | | |
| 11 | Freq01 | – | – | \multicolumn{6}{c}{U_N$_{INT}$[5:0]} | | | | | |
| 12 | Freq02 | \multicolumn{8}{c}{U_N$_{FRAC}$[23:16]} | | | | | | | |
| 13 | Freq03 | \multicolumn{8}{c}{U_N$_{FRAC}$[15:8]} | | | | | | | |
| 14 | Freq04 | \multicolumn{8}{c}{U_N$_{FRAC}$[7:0]} | | | | | | | |

FIG. 5

| ADDRESS | REGISTER NAME | bit7 | bit6 | bit5 | bit4 | bit3 | bit2 | bit1 | bit0 |
|---|---|---|---|---|---|---|---|---|---|
| 10 | Freq10 | COEF[7:0] ||||||||
| ⋮ | ⋮ | ⋮ ||||||||
| 14 | Freq11 | ADSUB[7:0] ||||||||
| 15 | SysCtrl | – | – | – | – | – | NEWF | – | – |

FIG. 8

| ADDRESS | REGISTER NAME | bit7 | bit6 | bit5 | bit4 | bit3 | bit2 | bit1 | bit0 |
|---|---|---|---|---|---|---|---|---|---|
| 10 | Freq10 | COEF[7:0] | | | | | | | |
| ⋮ | ⋮ | ⋮ | | | | | | | |
| 14 | Freq11 | ADSUB[7:0] | | | | | | | |

FIG. 11

| ADDRESS | REGISTER NAME | bit7 | bit6 | bit5 | bit4 | bit3 | bit2 | bit1 | bit0 |
|---|---|---|---|---|---|---|---|---|---|
| 10 | Freq00 | - | - | - | - | U_ODIV[3:0] | | | |
| 11 | Freq01 | - | - | U_N$_{INT}$[5:0] | | | | | |
| 12 | Freq02 | U_N$_{FRAC}$[23:16] | | | | | | | |
| 13 | Freq03 | U_N$_{FRAC}$[15:8] | | | | | | | |
| 14 | Freq04 | U_N$_{FRAC}$[7:0] | | | | | | | |
| ⋮ | ⋮ | | | | ⋮ | | | | |
| 100 | SysCtrl | - | - | - | - | - | NEWF | - | - |

OSCILLATION CIRCUIT, OSCILLATOR, ELECTRONIC DEVICE, AND MOVING OBJECT

BACKGROUND

1. Technical Field

The present invention relates to an oscillation circuit, an oscillator, an electronic device, and a moving object.

2. Related Art

In recent years, oscillators including a serial interface have been used. In such oscillators, a method can be used for changing an output frequency, for example, by changing the setting of a multiplication number of a phase locked loop (PLL) by operating a register within the oscillator using a serial interface.

For example, "Si570 data sheet", [online], Silicon Laboratories, [searched on Sep. 30, 2013], the Internet <URL: http://www.silabs.com/Support %20Documents/TechnicalDo cs/si570.pdf> discloses that it is possible to control a timing at which an output frequency is changed by storing a parameter for setting the output frequency in registers having addresses 14 to 18 and by writing predetermined data in registers having addresses 135 and 137 (see page 18 of the above-mentioned document).

Here, when an oscillator is used in a device constituting, for example, network synchronization, it is necessary to increase the modulation bandwidth. In the network synchronization, since it is necessary to make the clocks of respective devices conform to each other quickly and with a high level of accuracy, the oscillator constituting the network synchronization requires a high modulation bandwidth.

In order to increase the modulation bandwidth, a method using a parallel interface or an analog signal may also be used. However, when the parallel interface is used, the number of terminals of the oscillator increases, which is contrary to the demand for miniaturization. In addition, when the analog signal is used, problems such as frequency deviation based on a secular change in an analog device or a change in a characteristic due to temperature occur. Accordingly, it becomes difficult to make the clocks of the respective devices conform to each other with a high level of accuracy. Consequently, it is preferable that the modulation bandwidth be increased using a serial interface.

When the oscillator uses a serial interface, it is possible to increase the modulation bandwidth by reducing the amount of transmitted data necessary for a change in output frequency. For example, in the inventions disclosed in JP-A-05-284021 and JP-A-2006-5489, the amount of information transmitted is suppressed by encoding the setting of a PLL. However, in these inventions, the number of set states of the PLL, that is, the number of combinations of frequency-division ratios for determining the output frequency is limited in order to compress the amount of data transmitted through the encoding. The limitation of the combinations of the frequency-division ratios makes it difficult to make clocks conform to each other with a high level of accuracy. Accordingly, even when the technique disclosed in JP-A-05-284021 or JP-A-2006-5489 is applied, it is difficult to realize an oscillator suitable for network synchronization.

In addition, an oscillator disclosed in JP-A-2013-98872 adjusts an output frequency by setting a ratio with respect to a nominal frequency via a serial interface. The oscillator disclosed in JP-A-2013-98872 can set a variable width in accordance with a range of use and can set a frequency in the variable width with a high level of accuracy, as compared with the inventions disclosed in JP-A-05-284021 and JP-A-2006-5489. However, for example, it is assumed that the adjustment of the frequency is executed during the supply of power (paragraph 0029 of JP-A-2013-98872), and thus it is difficult to continuously change the frequency. For example, a second register storing a ratio with respect to a nominal frequency is divided into three addresses in order to respond to a request for setting a frequency with a high level of accuracy (FIG. 4 of JP-A-2013-98872). In order to change the frequency, it is necessary to rewrite all pieces of information of the three addresses, which results in a decrease in the modulation bandwidth.

SUMMARY

An advantage of some aspects of the invention is to provide an oscillation circuit, an oscillator, an electronic device, and a moving object which are capable of adjusting an output frequency in a high modulation bandwidth with a high level of accuracy and adjusting a timing at which the output frequency is changed.

The invention can be implemented as the following forms or application examples.

Application Example 1

This application example is directed to an oscillation circuit that generates an oscillation signal by oscillating an oscillation element, the oscillation circuit including: a communication unit that receives frequency setting data for setting a frequency of the oscillation signal and frequency change data which is given a timing at which the frequency of the oscillation signal is changed on the basis of the frequency setting data, by serial transfer; and registers in which the frequency setting data and the frequency change data received by the communication unit are stored, respectively. An address of the register storing the frequency setting data is provided continuously with an address of the register storing the frequency change data.

According to the oscillation circuit of this application example, an address of the register storing the frequency setting data is continuous with an address of the register storing the frequency change data. For example, in serial communication using an I2C, when a master continuously transmits data, an address is automatically incremented in a slave. Thus, writing in the registers having the continuous addresses can be continuously performed. When the oscillation circuit according to this application example is a slave of an I2C, it is possible to store the frequency setting data in the register, and then to store the frequency change data in the register without requiring the setting of a new address. Since the setting of an address is not required halfway, it is possible to reduce the amount of data transferred which is required to set a frequency of an oscillation signal and to increase the modulation bandwidth. In addition, a digital signal is used, and thus it is possible to adjust an output frequency with a high level of accuracy by adjusting a bit length of the frequency setting data. In addition, it is possible to adjust a timing at which an output frequency is changed by using the frequency change data, and thus a problem does not occur in which an oscillation signal having an unintended frequency is output in a state where a portion of the frequency change data is changed.

Application Example 2

This application example is directed to an oscillation circuit that generates an oscillation signal by oscillating an oscillation element, the oscillation circuit including: a communication unit that receives frequency setting data for setting a frequency of the oscillation signal, by serial transfer; and registers that store the frequency setting data received by the communication unit by division in transfer units of the serial transfer. The frequency setting data is written in a register having a predetermined address among the registers storing the frequency setting data, so that the frequency of the oscillation signal is changed on the basis of the frequency setting data.

According to the oscillation circuit of this application example, the frequency of an oscillation signal is changed by the frequency setting data being written in a register having a predetermined address among registers storing the frequency change data, and thus it is possible to adjust a timing at which the output frequency is changed in the transfer order of the serial transfer. For example, in a case where the oscillation circuit according to this application example is a slave of an I2C when a register having the longest address among the registers storing the frequency change data is set to be the above-mentioned register having the predetermined address, an output frequency is changed after all pieces of frequency setting data are written by an automatic increment of an address. For this reason, a problem does not occur in that an oscillation signal having an unintended frequency is output in a state where a portion of the frequency change data is changed. In addition, a digital signal is used, and thus it is possible to adjust an output frequency with a high level of accuracy by adjusting a bit length of the frequency setting data. In addition, it is not necessary to transmit dedicated data for instructing a timing at which an output frequency is changed, and thus it is possible to reduce the data to be received to set a frequency of an oscillation signal and to increase the modulation bandwidth.

Application Example 3

In the oscillation circuit according to the application example described above, the communication unit may receive the frequency setting data including first setting data and second setting data, and a difference between a frequency before the change of the oscillation signal and a frequency after the change thereof may be given as a value obtained by multiplying the first setting data by the second setting data.

Application Example 4

In the oscillation circuit according to the application example described above, the communication unit may receive the frequency setting data including first setting data and second setting data, a difference between a frequency before the change of the oscillation signal and a frequency after the change thereof may be given as a value obtained by multiplying the first setting data by the second setting data, and the register having a predetermined address may be a register that stores the first setting data.

According to the oscillation circuit of this application example, the frequency setting data indicates a difference between frequencies before and after the change, and includes the first setting data and the second setting data. For this reason, it is possible to further reduce the data to be received to set a frequency of an oscillation signal and to increase the modulation bandwidth, as compared with a case where all parameters of a calculation expression for determining an output frequency are designated.

At this time, when an address of a register storing the first setting data is set to be the predetermined address, it is not necessary to transfer dedicated data for instructing a timing at which an output frequency is changed. Thus, it is possible to increase the modulation bandwidth by further reducing the data to be received to set a frequency of an oscillation signal.

Application Example 5

In the oscillation circuit according to the application example described above, the second setting data may be data for determining the amount of shift of the first setting data.

According to the oscillation circuit of this application example, since multiplication between the first setting data and the second setting data can be realized using a bit shifter without using a multiplier, an increase in a circuit size is suppressed, and thus it is possible to realize a small-sized oscillation circuit.

Application Example 6

This application example is directed to an oscillator including the oscillation circuit according to the application example described above and the oscillation element.

Application Example 7

This application example is directed to an electronic device including the oscillation circuit according to the application example described above or the oscillator according to the application example described above.

Application Example 8

This application example is directed to a moving object including the oscillation circuit according to the application example described above or the oscillator according to the application example described above.

The oscillator, the electronic device, and the moving object according to the application examples include the oscillation circuit according to the application example described above, and thus it is possible to adjust the output frequency thereof in a high modulation bandwidth with a high level of accuracy and to adjust a timing at which the output frequency is changed. For this reason, it is possible to provide the oscillator, the electronic device, and the moving object which are capable of immediately obtaining a desired frequency.

BRIEF DESCRIPTION OF THE DRAWINGS

The invention will be described with reference to the accompanying drawings, wherein like numbers reference like elements.

FIG. 2 is a diagram illustrating a register map of the oscillation circuit according to the first embodiment.

FIG. 5 is a diagram illustrating a register map of the oscillation circuit according to the second embodiment.

FIG. 8 is a diagram illustrating a register map of the oscillation circuit according to the third embodiment.

FIG. 11 is a diagram illustrating a register map of the oscillation circuit according to the fourth embodiment.

DESCRIPTION OF EXEMPLARY EMBODIMENTS

Hereinafter, preferred embodiments of the invention will be described in detail with reference to the accompanying drawings. Meanwhile, the embodiments described below do not unduly limit the aspects of the invention described in the appended claims. In addition, all of the configurations described below are not necessarily essential components of the invention.

Figure 1:
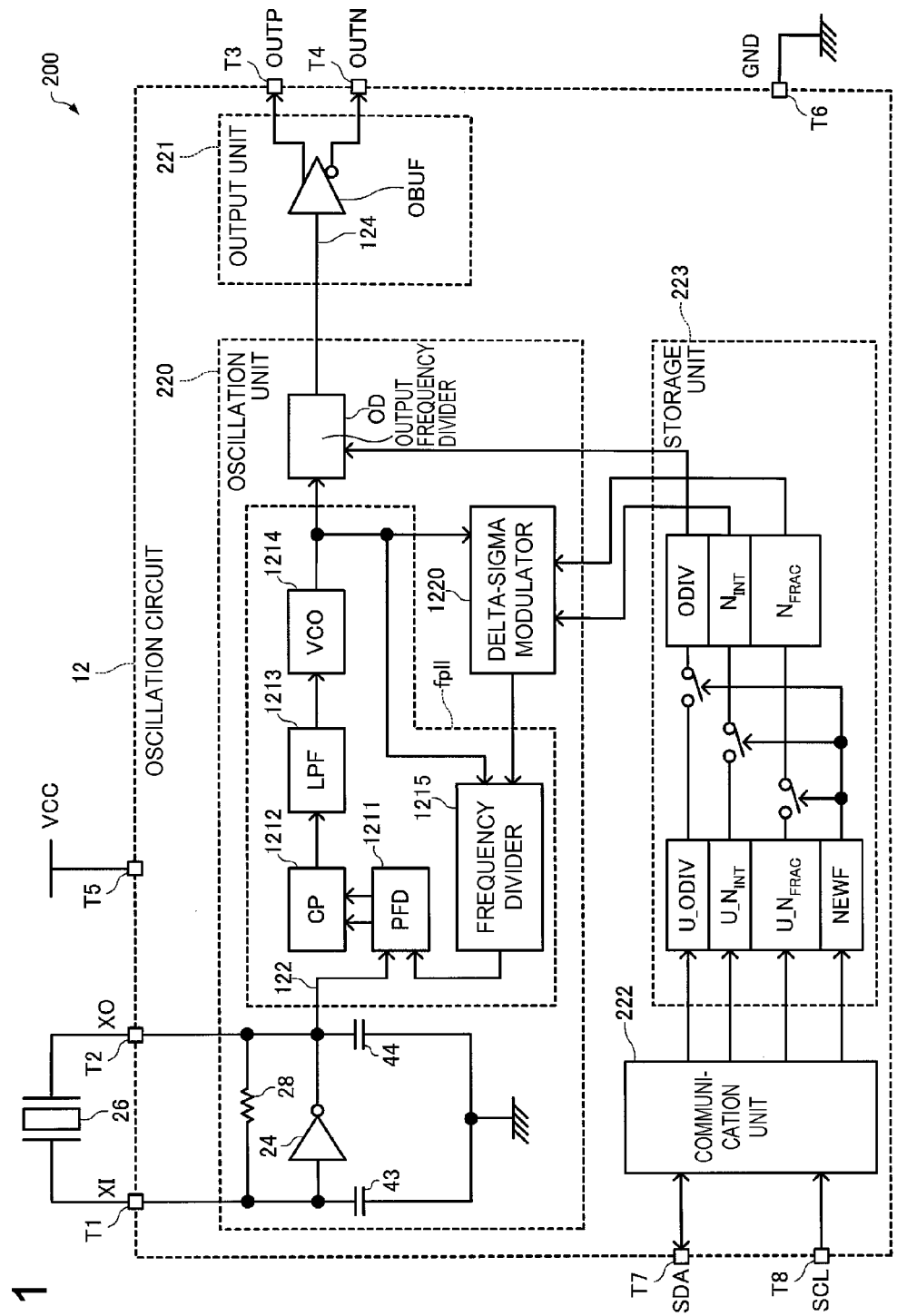
FIG. 1 is a block diagram of an oscillator including an oscillation circuit according to a first embodiment.

1. Oscillation Circuit and Oscillator 1.1. First Embodiment 1.1.1. With Regard to Overall Configuration FIG. 1 is a block diagram of an oscillator 200 including an oscillation circuit 12 according to a first embodiment. The oscillation circuit 12 includes an oscillation unit 220 that generates an oscillation signal 124 by oscillating an oscillation element, an output unit 221 that receives the oscillation signal 124 from the oscillation unit 220, converts the signal into a predetermined output format, and outputs the converted signal, a communication unit 222 that performs serial communication with the outside, and a storage unit 223 that includes a register capable of being updated from the outside by the serial communication.

In this embodiment, an AT cut quartz crystal resonator 26 is used as the oscillation element, but the invention is not limited thereto. For example, an SC cut quartz crystal resonator, a tuning fork type quartz crystal resonator, a surface acoustic wave (SAW) resonator, other piezoelectric vibrators, a micro electromechanical system (MEMS) resonator, or the like can be used.

The oscillation circuit 12 constitutes a portion of the oscillator 200. Examples of the oscillator 200 include a piezoelectric oscillator (quartz crystal oscillator or the like) such as a simple packaged crystal oscillator (SPXO: quartz crystal oscillator), a temperature compensated crystal oscillator (TCXO: temperature compensation type oscillator), a voltage-controlled crystal oscillator (VCXO: voltage-controlled oscillator), or an oven-controlled crystal oscillator (OCXO: constant temperature oscillator), a SAW oscillator, a silicon oscillator, an atomic oscillator, and the like. Description will be given on the assumption that the oscillation circuit 12 according to this embodiment constitutes a portion of an SPXO. Here, a difference in components between the oscillator 200 and the oscillation circuit 12 is in only the quartz crystal resonator 26, and the oscillation circuit 12 and the quartz crystal resonator 26 constitute the oscillator 200. Hereinafter, a description of the oscillation circuit 12 may be given with a description of the oscillator 200 without giving particular notice.

As shown in FIG. 1, the oscillation circuit 12 may be formed as an integrated circuit (IC) and may include terminals T1 and T2 for connecting with the quartz crystal resonator 26. In FIG. 1, it is assumed that an input signal on the terminal T1 side is XI and an output signal on the terminal T2 side is XO. The oscillation circuit 12 may include terminals T3 and T4 for differentially outputting the oscillation signal 124. Here, it is assumed that a non-inverted output signal on the terminal T3 side is OUTP and an inverted output signal on the terminal T4 side is OUTN. The oscillation circuit 12 may include terminals T5 and T6 for supplying a power supply voltage VCC and a ground voltage GND, respectively. The oscillation circuit 12 may include terminals T7 and T8 which are two-wire serial interfaces. In this embodiment, an inter-integrated circuit (I2C) is used as a system of a serial interface, and it is assumed that serial data on the terminal T7 side is SDA and a serial clock on the terminal T8 side is SCL.

Meanwhile, the oscillation circuit 12 may be integrated including the quartz crystal resonator 26 to constitute the packaged oscillator 200. In addition, a system other than the I2C may be used as the system of the serial interface as long as the system automatically increments (or decrements) an address in a case of continuous data writing. At this time, the invention is not limited to the two-wire serial interface, and a one-wire or three or more-wire serial interface may be used. In this embodiment, the oscillation signal 124 is differentially output, however, a single-ended output may be used.

1.1.2. With Regard to Oscillation Unit and Output Unit

The oscillation unit 220 includes a main circuit unit that generates a reference oscillation signal 122 (signal serving as a reference of the oscillation signal 124) by oscillating the quartz crystal resonator 26, a fractional N-PLL (fpll of FIG. 1), a delta-sigma modulator 1220, and an output frequency divider OD that frequency-divides a signal received from the fractional N-PLL and outputs the signal as the oscillation signal 124.

The main circuit unit is constituted by an inverter 24, including a feedback resistor 28 functioning as an analog inverting amplifier, and capacitive elements 43 and 44 being connected to each other as shown in FIG. 1. An input side and an output side of the inverter 24 are connected to the quartz crystal resonator 26 through the terminals T1 and T2, respectively, and generate the reference oscillation signal 122 by oscillating the quartz crystal resonator 26.

The fractional N-PLL (fpll of FIG. 1) is a PLL that realizes a frequency-division ratio, which is on average a decimal between $N_{INT}$ and $N_{INT}+1$ which are integers, by switching a frequency-division ratio of a frequency divider 1215 that frequency-divides an output of a VCO 1214. The fractional N-PLL includes a phase frequency detector (PFD) 1211, a charge pump (CP) 1212, a low-pass filter (LPF) 1213, a voltage-controlled oscillator (VCO) 1214, and a frequency divider 1215. In addition, the delta-sigma modulator 1220 generates a signal for instructing the switching of the frequency-division ratio of the frequency divider 1215.

The PFD 1211 receives the reference oscillation signal 122 as a reference signal, detects a phase difference from a feedback signal received from the frequency divider 1215, and outputs an UP signal and a DOWN signal in accordance with the phase difference. The CP 1212 outputs a current having a value based on the UP signal and the DOWN signal. The LPF 1213 controls the VCO 1214 by removing a high frequency noise component from the current and converting the current into a voltage. The VCO 1214 changes an output frequency in accordance with a control voltage output from the LPF 1213. The frequency divider 1215 frequency-divides an output signal of the VCO 1214 and outputs the signal as a feedback signal to the PFD 1211.

The delta-sigma modulator 1220 temporally switches the frequency-division ratio in the frequency divider 1215 using $N_{INT}$ and $N_{INT}+1$ by the setting of the frequency-division ratio. When it is assumed that a frequency of a reference signal (reference oscillation signal 122) is $F_{REF}$, an integer portion of the frequency-division ratio is $N_{INT}$, and a fraction portion (portion after the decimal point) thereof is $N_{FRAC}/2^m$, a frequency $F_{VCO}$ of the output signal of the VCO 1214 is expressed by the following Expression (1).

$$F_{VCO} = F_{REF} \times \left( N_{INT} + \frac{N_{FRAC}}{2^m} \right) \quad (1)$$

Meanwhile, "m" denotes the number of bits of $N_{FRAC}$, and $N_{FRAC}/2^m$ denotes a value which is less than 1. For example, $N_{FRAC}$ may be a value of 24 bits (m=24). In addition, $N_{INT}$ may be a value of, for example, 6 bits.

In addition, since the frequency-division ratio can be aperiodically switched by using the delta-sigma modulator 1220, there is an advantage in that fractional spuriousness which is inherent spuriousness depending on a switching period is not likely to occur. Meanwhile, an accumulator type fractional N-PLL using an accumulator may be used instead of the delta-sigma modulator 1220.

The output frequency divider OD frequency-divides a signal received from the fractional N-PLL and outputs the signal as the oscillation signal 124. When the frequency-division ratio of the output frequency divider OD is assumed to be ODIV, a frequency $F_o$ of the oscillation signal 124 is expressed by the following Expression (2).

$$F_O = \frac{F_{VCO}}{ODIV} = \frac{F_{REF} \times \left( N_{INT} + \frac{N_{FRAC}}{2^m} \right)}{ODIV} \quad (2)$$

The output unit 221 converts the oscillation signal 124 into a differential signal by an output buffer OBUF and outputs the converted signal. The oscillation circuit 12 according to this embodiment outputs a non-inverted output signal OUTP from the terminal T3 and an inverted output signal OUTN from the terminal T4.

1.1.3. With Regard to Communication Unit and Storage Unit

As described above, the frequency $F_o$ of the oscillation signal 124 can be changed by $N_{INT}$, $N_{FRAC}$, and ODIV which are parameters of Expression (2). This makes it possible to generate the oscillation signal 124 having various frequencies in the oscillation circuit 12, thereby providing the user-friendly oscillation circuit 12. Here, in order to update these parameters without greatly increasing the number of terminals, an I2C which is two-wire serial communication is used as the system of the serial interface in the oscillation circuit 12 according to this embodiment. The oscillation circuit 12 is handled as one slave in the communication using an I2C.

The communication unit 222 converts received serial data into parallel data and converts data to be output from the oscillation circuit 12 into serial data. As shown in FIG. 1, when the communication unit 222 receives the parameters of Expression (2), the communication unit outputs the parameters to the storage unit 223 and updates the value of a register. The storage unit 223 includes registers U_$N_{INT}$, U_$N_{FRAC}$, and U_ODIV that store $N_{INT}$, $N_{FRAC}$, and ODIV, respectively. Meanwhile, the parameters $N_{INT}$, $N_{FRAC}$, and ODIV correspond to frequency setting data according to the invention.

Here, in order to adjust the frequency $F_o$ of the oscillation signal 124 with a high level of accuracy, $N_{FRAC}$ has a larger number of bits than a transfer unit (8 bits) of an I2C of, for example, 24 bits. For this reason, $N_{FRAC}$ is required to be transferred multiple times. In addition, $N_{INT}$ and ODIV cannot be transferred at the same time as $N_{FRAC}$ and are required to be transferred separately. For this reason, a state occurs where previous parameters and new parameters are mixed with each other during the process of updating the values of the registers U_$N_{INT}$, U_$N_{FRAC}$, and U_ODIV.

It is assumed that the values of the registers U_$N_{INT}$, U_$N_{FRAC}$, and U_ODIV are used as it is in the delta-sigma modulator 1220 and the output frequency divider OD. At this time, when the frequency $F_o$ of the oscillation signal 124 is changed during the operation of the oscillation circuit 12, a state occurs where previous parameters and new parameters are mixed with each other. Accordingly, there is a possibility of the oscillation signal 124 with an unintended frequency being output. This is because there is a possibility that the operation of the entire system using the non-inverted output signal OUTP and the inverted output signal OUTN of the oscillation circuit 12 as clocks may become unstable, and thus this possibility has to be avoided.

Consequently, the storage unit 223 includes registers ($N_{INT}$, $N_{FRAC}$, ODIV) with the same name which store $N_{INT}$, $N_{FRAC}$, and ODIV, respectively, separate from the registers U_$N_{INT}$, U_$N_{FRAC}$, and U_ODIV. The values of the registers ($N_{INT}$, $N_{FRAC}$, ODIV) are used in the delta-sigma modulator 1220 and the output frequency divider OD. The registers U_$N_{INT}$, U_$N_{FRAC}$, and U_ODIV temporarily store the changed parameters ($N_{INT}$, $N_{FRAC}$, ODIV). Then, the registers $N_{INT}$, $N_{FRAC}$, and ODIV receive the values of the registers U_$N_{INT}$, U_$N_{FRAC}$, and U_ODIV at an appropriate timing. The appropriate timing is a timing after all the changed parameters are written in the registers U_$N_{INT}$, U_$N_{FRAC}$, and U_ODIV.

The storage unit 223 has a register (NEWF) with the same name which stores NEWF. Here, NEWF is a signal of, for example, 1 bit. When NEWF is changed from "0" to "1", the registers $N_{INT}$, $N_{FRAC}$, and ODIV receive the values of the registers $U\_N_{INT}$, $U\_N_{FRAC}$, and U_ODIV, respectively. In other words, a master (for example, an external CPU of the oscillation circuit 12) of an I2C can avoid the output of the oscillation signal 124 having an unintended frequency by writing "1" in the register NEWF having a value of "0" after all parameters to be changed are written in the registers $U\_N_{INT}$, $U\_N_{FRAC}$, and U_ODIV. Therefore, the oscillation circuit 12 can adjust an output frequency (frequency of the oscillation signal 124 or the differential signal thereof) with a high level of accuracy by using a parameter such as, for example, $N_{FRAC}$ having a sufficiently large number of bits, and can adjust a timing at which the output frequency is changed, using NEWF. Meanwhile, NEWF corresponds to frequency change data according to the invention. In addition, a circuit is not shown in FIG. 1, but the value of the register NEWF is changed to "1" and is then returned to "0" when an operation is completed in which the registers $N_{INT}$, $N_{FRAC}$, and ODIV receive the values of the registers $U\_N_{INT}$, $U\_N_{FRAC}$, and U_ODIV.

1.1.4. Register Address of Comparative Example

For example, when the oscillation circuit 12 is used in a device constituting network synchronization, a frequency can be continuously designated with a high level of accuracy, and the modulation bandwidth thereof is required to be increased. For example, when the required modulation bandwidth has a frequency of 4 kHz, an output frequency is required to be adjusted 4000 times per second. Since a serial clock SCL of an I2C has a frequency of, for example, 400 kHz, it is necessary to increase the modulation bandwidth by reducing the amount of transfer of a parameter which is required to set the frequency (to change the frequency).

Here, a description will be given of an oscillator according to a comparative example for comparison with the oscillation circuit 12 according to this embodiment. The oscillator according to the comparative example has the same configuration as that of the oscillation circuit 12 according to this embodiment, but there is a difference therebetween in the addresses to which registers $U\_N_{INT}$, $U\_N_{FRAC}$, U_ODIV, and NEWF are mapped.

Figures 17, 18:
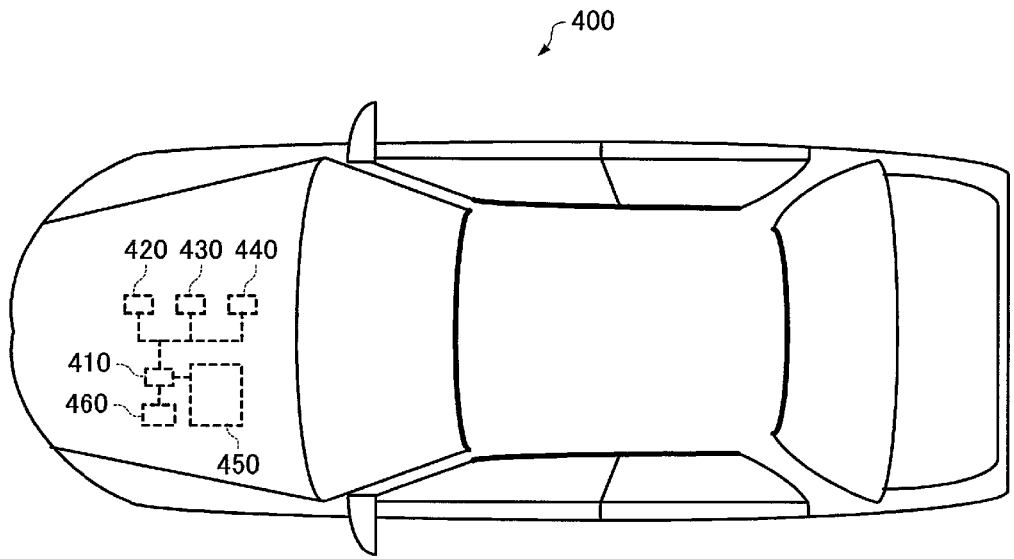
FIG. 17 is a diagram showing an example of a moving object.
FIG. 18 is a diagram illustrating a register map of an oscillation circuit according to a comparative example.

FIG. 18 is a diagram showing a register map of an oscillation circuit according to a comparative example. A register U_ODIV is allocated to the lower-order 4 bits of a register name "Freq00" having an address of 10. A register $U\_N_{INT}$ is allocated to the lower-order 6 bits of a register name "Freq01" having an address of 11. A register $U\_N_{FRAC}$ is divided by 8 bits which are a transfer unit, and thus is allocated to addresses 12, 13, and 14 (of which the register names are "Freq02", "Freq03", and "Freq04", respectively). Specifically, the bits 23 to 16 of the register $U\_N_{FRAC}$ are allocated to the address 12, the bits 15 to 8 thereof are allocated to the address 13, and the bits 7 to 0 thereof are allocated to the address 14.

Here, in the oscillation circuit according to the comparative example, a register NEWF is allocated to bit2 of a register name "SysCtrl" having an address of 100. In other words, with regard to the address, the register NEWF is discontinuously mapped to the registers $U\_N_{INT}$, $U\_N_{FRAC}$, and U_ODIV.

In serial communication using an I2C, when a master (for example, a CPU) continuously transmits data, an address is automatically incremented in a slave (for example, the oscillation circuit according to the comparative example and the oscillation circuit 12 according to this embodiment), and thus continuous writing can be performed. However, when writing is performed on registers having discontinuous addresses, a procedure for designating the addresses of the registers again is required.

Figure 19:
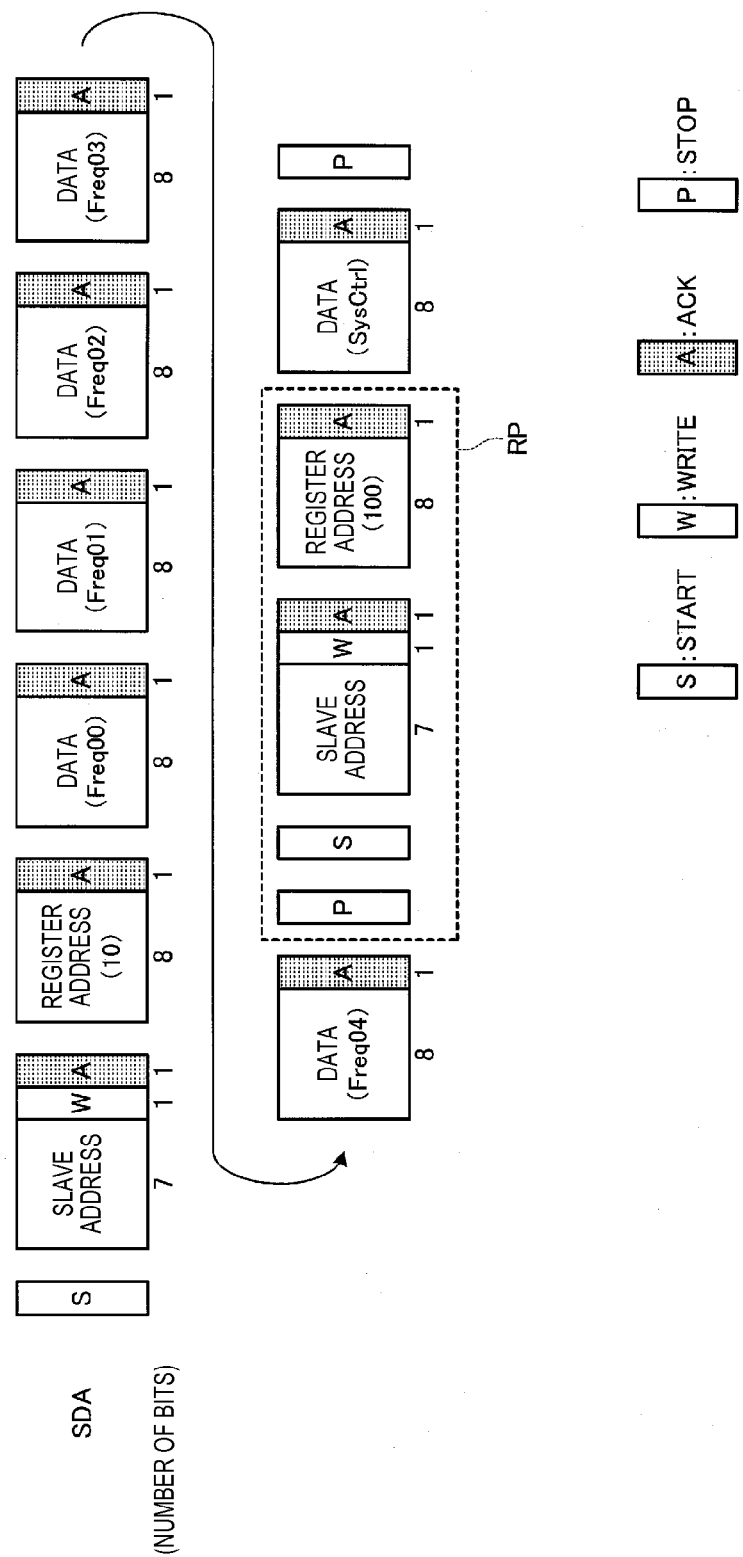
FIG. 19 is a diagram illustrating a procedure of communication with the oscillation circuit according to the comparative example.

FIG. 19 is a diagram showing a procedure of communication with the oscillation circuit according to the comparative example. In this example, a master changes all of $N_{INT}$, $N_{FRAC}$, and ODIV, changes NEWF from "0" to "1", and reflects the NEWF in an output frequency. As shown in FIG. 19, first, the master starts communication by setting a start condition (S of FIG. 19). The start condition is a state where serial data SDA transitions from a high level to a low level when a serial clock SCL is in a high level.

The master outputs a slave address of 7 bits and a write signal (W of FIG. 19) for designating the oscillation circuit according to the comparative example. When a correct slave address is designated, the oscillation circuit according to the comparative example outputs an ACK signal (A of FIG. 19). Thereafter, the master designates a smallest address ("10", that is, an address of "Freq00" in the example of FIG. 19) among addresses of registers on which writing is to be performed. Then, data from "Freq00" to "Freq04" (data (Freq00) to data (Freq04) of FIG. 19) are continuously output. Meanwhile, the oscillation circuit according to the comparative example outputs an ACK signal whenever the circuit receives a register address and data of 8 bits. The oscillation circuit according to the comparative example updates data of registers having addresses 10 to 14 by automatically incrementing a register address thereinside.

Next, the master is required to change NEWF from "0" to "1" and reflect the updated parameter in an output frequency. However, the register NEWF is allocated to "SysCtrl" of which the address is not continuous with "Freq04". Accordingly, the master is required to set a stop condition (P of FIG. 19) and stop this communication once. Meanwhile, the stop condition is a state where the serial data SDA transitions from a low level to a high level when the serial clock SCL is in a high level.

Then, the master sets a start condition again to start communication and outputs a slave address and a write signal of 7 bits, and then designates 100 which is an address of "SysCtrl" (register address (100) of FIG. 19). Then, the master outputs data so that the register NEWF is changed to "1" (data (SysCtrl) of FIG. 19).

In the oscillation circuit according to the comparative example, the master is required to stop communication once during a stop condition and then start the communication again. In addition, the master is required to designate a slave address and a register address twice, and thus repeated portions (portions shown by RP of FIG. 19) are present.

1.1.5. Register Address of this Embodiment

On the other hand, FIG. 2 is a diagram showing a register map of the oscillation circuit 12 according to this embodiment. Meanwhile, the same components as those in FIG. 18 are denoted by the same reference numerals and signs, and thus the description thereof will not be given here. In the register map of the oscillation circuit 12 according to this embodiment, an address of "SysCtrl" having a register NEWF allocated thereto is 15, unlike that of the comparative example. In other words, the register NEWF is continuously mapped to a register $U\_N_{FRAC}$.

Meanwhile, as described in this embodiment, when serial communication is used in which an address is automatically incremented, the register NEWF is mapped to an address next to the last address among the addresses to which registers U_$N_{INT}$, U_$N_{FRAC}$, and U_ODIV are mapped. As another embodiment, when serial communication is used in which an address is automatically decremented, the register NEWF is mapped to an address one before the first address among the addresses to which the registers U_$N_{INT}$, U_$N_{FRAC}$, and U_ODIV are mapped.

In addition, as shown in Expression (2), $N_{FRAC}$ is a parameter that adjusts a decimal portion, and a least significant bit (LSB) of $N_{FRAC}$ has a tendency to be changed even when an output frequency is roughly adjusted or is finely adjusted. For this reason, it is preferable that addresses of a register ("Freq04" of FIG. 2) which stores the LSB of $N_{FRAC}$ and "SysCtrl" be continuous with each other. For example, when an output frequency is finely adjusted, only "Freq04" may be changed. Even in this case, the output frequency can be changed by continuous writing, and thus it is not necessary for a master to designate the address of "SysCtrl" by stopping and restarting communication.

Figure 3:
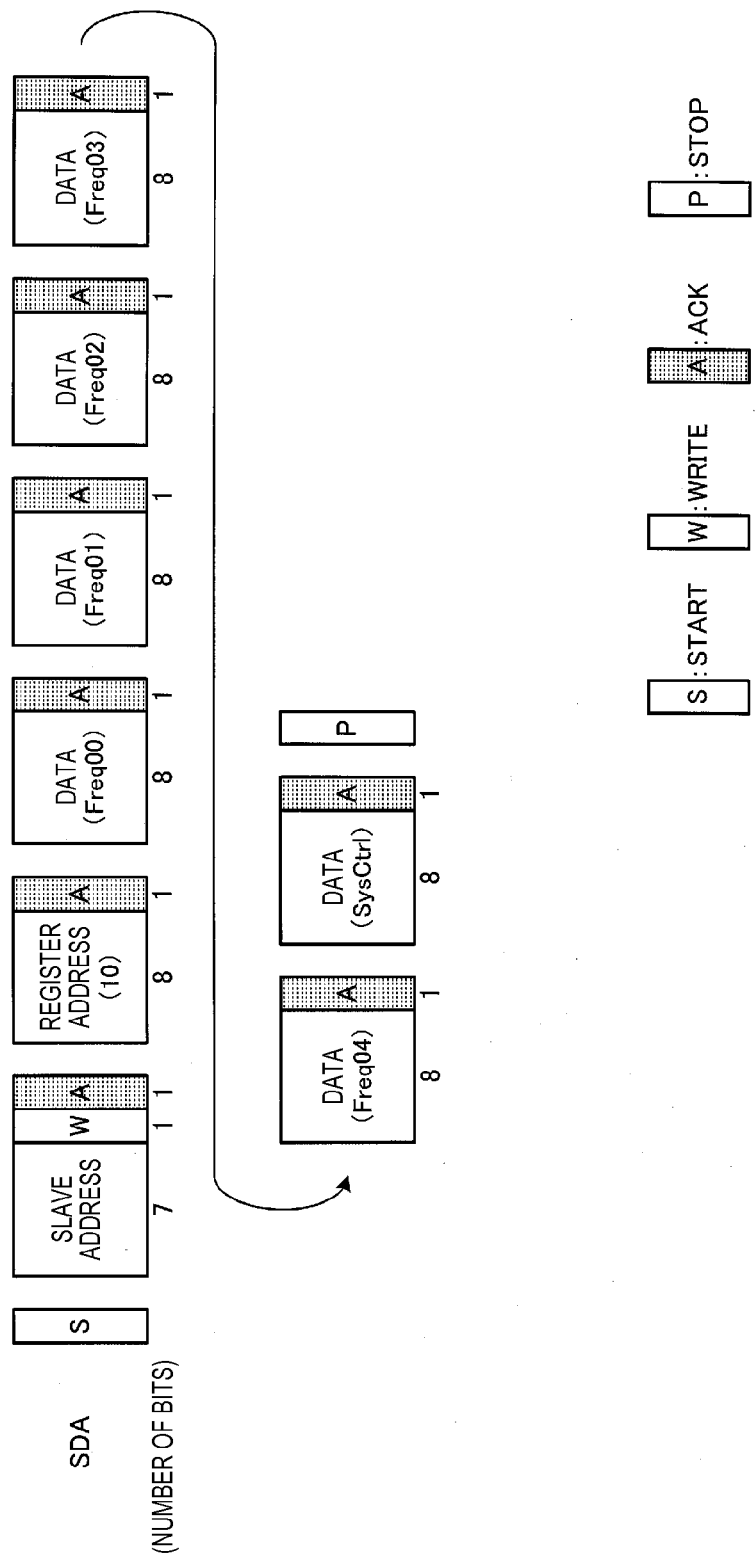
FIG. 3 is a diagram illustrating a procedure of communication with the oscillation circuit according to the first embodiment.

FIG. 3 is a diagram showing a procedure of communication with the oscillation circuit 12 according to this embodiment. Meanwhile, the same components as those in FIG. 19 are denoted by the same reference numerals and signs, and thus the description thereof will not be given here. In the oscillation circuit 12 according to this embodiment, a master is not required to designate the address of "SysCtrl" again unlike in the comparative example, and thus can continuously write data up to "SysCtrl" by using an automatic increment function. As shown in FIG. 3, the master may output data (SysCtrl) immediately subsequent to data (Freq04). At this time, the repeated portions (portions shown by RP of FIG. 19) which are necessary in the communication procedure of the comparative example can be omitted, and thus the amount of transfer of data is reduced, which allows a communication time necessary for a change in output frequency to be shortened. Accordingly, it is possible to increase the modulation bandwidth in the oscillation circuit 12 according to this embodiment. Meanwhile, FIG. 3 is an example, and a master is not required to output all of data (Freq00) to data (Freq04). For example, as will be described later with reference to FIG. 15, the master may output some pieces of data having a large address in pieces of data having continuous addresses such as the data (Freq02) to the data (Freq04) and the data (Freq03) to the data (Freq04).

As described above, the oscillation circuit 12 according to this embodiment can adjust an output frequency with a high level of accuracy by using a parameter such as, for example, $N_{FRAC}$ having a sufficiently large number of bits, and can adjust a timing at which the output frequency is changed, using NEWF. In addition, the oscillation circuit sets NEWF to have an address which is continuous with the parameter, and thus the amount of transfer of data is reduced, which allows the modulation bandwidth to be increased.

1.2. Second Embodiment

Figure 4:
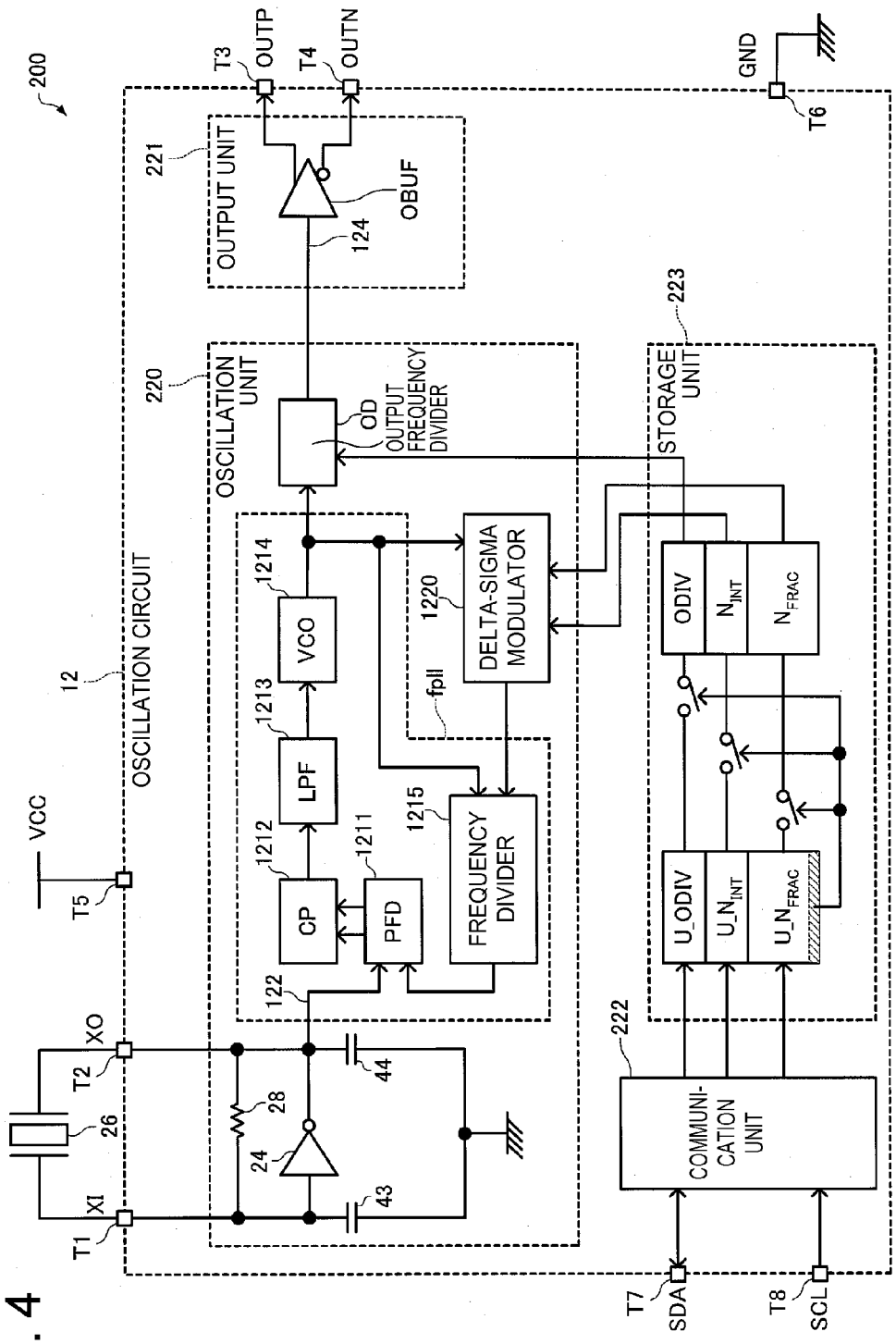
FIG. 4 is a block diagram of an oscillator including an oscillation circuit according to a second embodiment.

FIG. 4 is a block diagram of an oscillator 200 including an oscillation circuit 12 according to a second embodiment. The same components as those in FIG. 1 are denoted by the same reference numerals and signs, and thus the description thereof will not be given here. Unlike the oscillation circuit 12 according to the first embodiment, the oscillation circuit 12 according to this embodiment can adjust a timing at which an output frequency is changed, regardless of NEWF, and thus a storage unit 223 does not include the register NEWF. In addition, a master is not required to transmit NEWF, and thus it is possible to reduce the amount of transfer of data further than that of the oscillation circuit 12 according to the first embodiment. Accordingly, it is possible to further increase the modulation bandwidth in the oscillation circuit 12 according to this embodiment.

In the oscillation circuit 12 according to this embodiment, when data ($N_{FRAC}$[7:0]) including an LSB of $N_{FRAC}$ is written in a register "Freq04" of an address 14 (corresponding to a predetermined address according to the invention), registers $N_{INT}$, $N_{FRAC}$, and ODIV receive values of registers U_$N_{INT}$, U_$N_{FRAC}$, and U_ODIV, respectively, and thus output frequencies having the new parameters reflected therein are obtained.

In the oscillation circuit 12 according to this embodiment, a register "Freq04" doubles as the register NEWF in the first embodiment. Accordingly, it is possible to reduce the amount of transfer of data further than that of the oscillation circuit 12 according to the first embodiment, and thus the modulation bandwidth can be further increased.

Here, the oscillation circuit 12 according to this embodiment adjusts a timing at which an output frequency is changed in accordance with the order of transfer of serial transfer. Accordingly, it is necessary to write $N_{FRAC}$[7:0] at the end of data to be changed, in order to cause an oscillation signal having an unintended frequency not to be output. Therefore, when serial communication is used in which an address is automatically incremented as in this embodiment, the last address among the addresses having the registers U_$N_{INT}$, U_$N_{FRAC}$, and U_ODIV mapped thereto has to double as the register NEWF in the first embodiment.

FIG. 5 is a diagram showing a register map of the oscillation circuit 12 according to this embodiment. Meanwhile, the same components as those in FIGS. 2 and 18 are denoted by the same reference numerals and signs, and thus the description thereof will not be given here. The oscillation circuit 12 according to this embodiment does not include a register NEWF unlike the oscillation circuit 12 according to the first embodiment. In addition, the last address among the addresses having the registers U_$N_{INT}$, U_$N_{FRAC}$, and U_ODIV mapped thereto is 14, and is changed to a frequency based on a new parameter by writing $N_{FRAC}$[7:0] in the corresponding register "Freq04". In other words, "Freq04" doubles as the register NEWF in the first embodiment.

Figure 6:
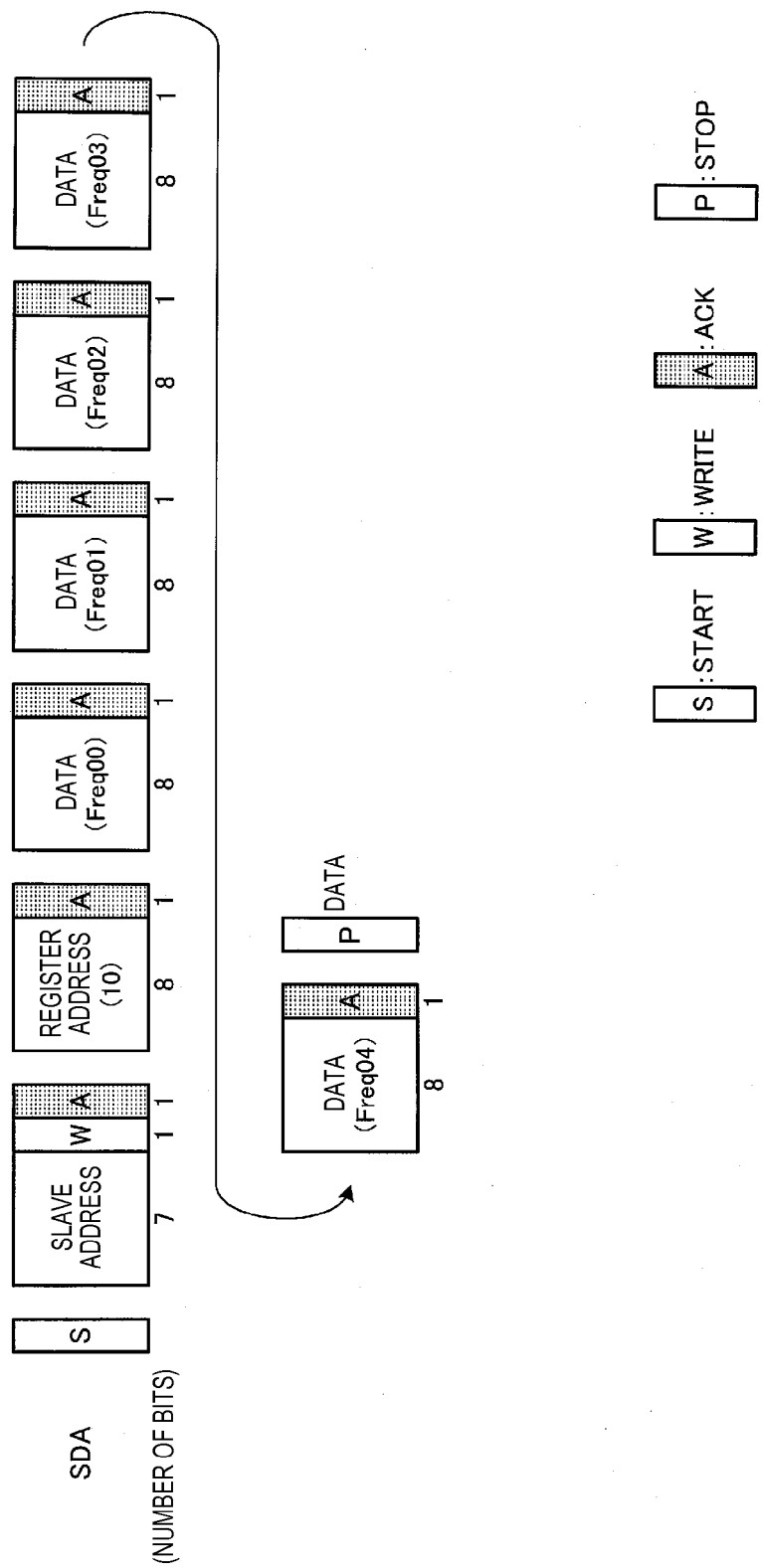
FIG. 6 is a diagram illustrating a procedure of communication with the oscillation circuit according to the second embodiment.

FIG. 6 is a diagram showing a procedure of communication with the oscillation circuit 12 according to this embodiment. Meanwhile, the same components as those in FIGS. 3 and 19 are denoted by the same reference numerals and signs, and thus the description thereof will not be given here. As shown in FIG. 6, in the oscillation circuit 12 according to this embodiment, a master does not output "data (SysCtrl)" as compared with the first embodiment, and thus the amount of transfer of data is further reduced, which allows a communication time necessary for a change in output frequency to be shortened. Accordingly, the oscillation circuit 12 according to this embodiment can further increase the modulation bandwidth.

Meanwhile, in the oscillation circuit 12 according to this embodiment, even assuming that there is no change with respect to $N_{FRAC}$[7:0], a master is required to output data (Freq04) at the end. In addition, FIG. 6 is an example, and a master is not required to output all of data (Freq00) to data (Freq03) and may output some of the data. In addition, only data (Freq04) may be output without outputting the data (Freq00) to the data (Freq03).

1.3. Third Embodiment

Figure 7:
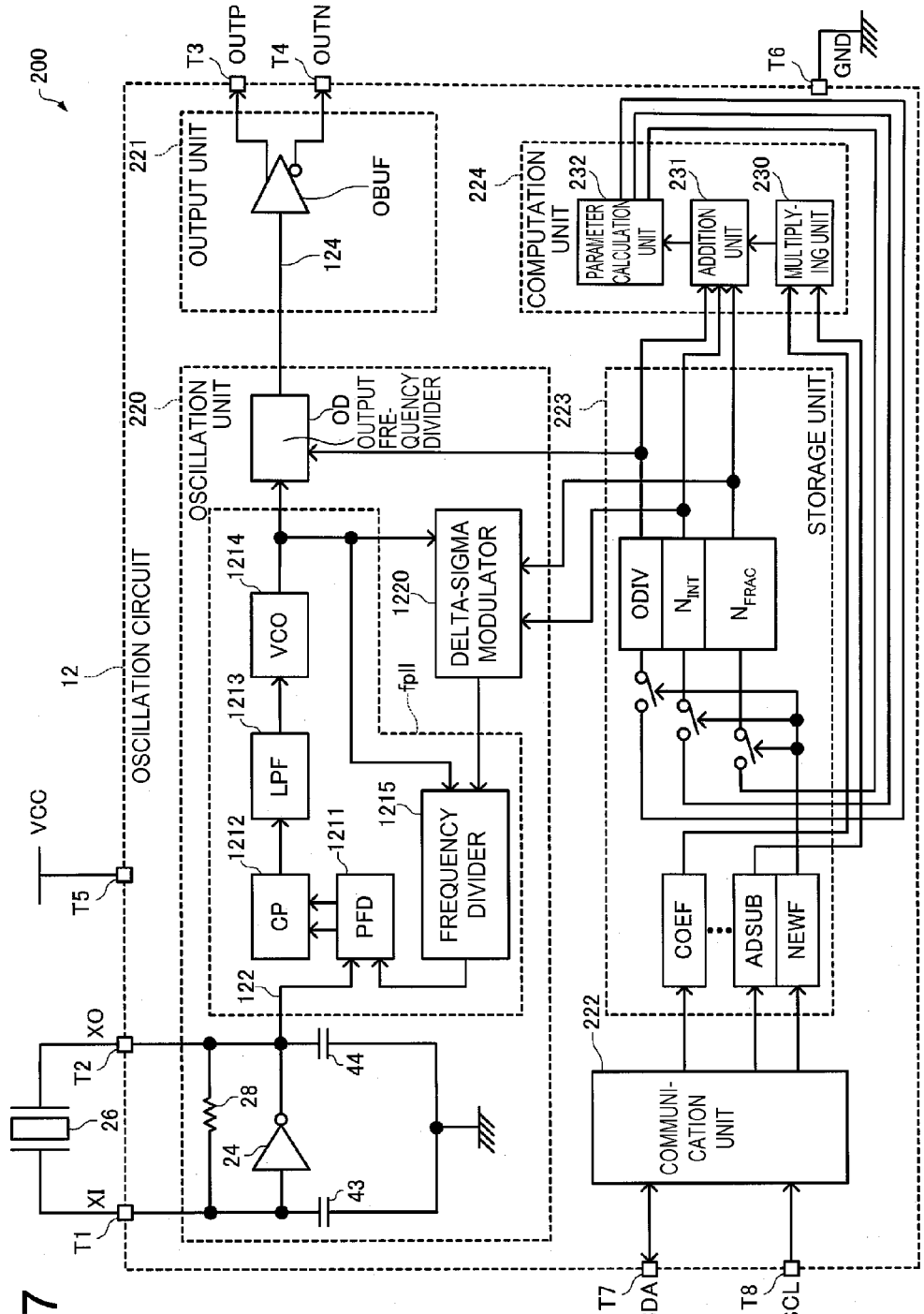
FIG. 7 is a block diagram of an oscillator including an oscillation circuit according to a third embodiment.

FIG. 7 is a block diagram of an oscillator 200 including an oscillation circuit 12 according to a third embodiment.

The same components as those in FIGS. 1 and 4 are denoted by the same reference numerals and signs, and thus the description thereof will not be given here. In the oscillation circuit 12 according to this embodiment, unlike the oscillation circuits 12 according to the first and second embodiments, a master designates COEF and ADSUB which are parameters that give the difference from the current output frequency. The oscillation circuit 12 according to this embodiment includes a computation unit 224, and the computation unit 224 calculates parameters ($N_{INT}$, $N_{FRAC}$, ODIV) for determining a new frequency from COEF and ADSUB and outputs the parameter. Accordingly, the master may output at least one of COEF and ADSUB as frequency setting data, and thus it is possible to reduce the amount of transfer of data further than in the oscillation circuits 12 according to the first and second embodiments. Therefore, it is possible to further increase the modulation bandwidth in the oscillation circuit 12 according to this embodiment.

In the first and second embodiments, a master calculates necessary parameters ($N_{INT}$, $N_{FRAC}$, ODIV) from a desired output frequency on the basis of Expression (2) and outputs the parameters. At this time, since adjustment can be performed with a high level of accuracy, $N_{FRAC}$ has a larger number of bits than a transfer unit (8 bits) of an I2C of, for example, 24 bits. Accordingly, transfer is required to be performed multiple times by using only $N_{FRAC}$.

In the oscillation circuit 12 according to this embodiment, a master designates COEF and ADSUB which are parameters that give a difference from the current output frequency. In the oscillation circuit 12 according to this embodiment, a new frequency (corresponding to "frequency after change" according to the invention) is shown by the difference from the current output frequency (corresponding to "frequency before change" according to the invention), and thus the number of bits of COEF and ADSUB can be reduced. Here, each of COEF and ADSUB may have a value of, for example, 8 bits. In particular, it is preferable that the number of bits of ADSUB be 8 bits which is the same as the number of bits of one transfer of an I2C in simultaneously pursuing a high-speed modulation bandwidth and high-accuracy frequency setting. At this time, ADSUB uses an integer, for example, between −128 and +127, and COEF is the coefficient thereof. As will be described later, the difference from the current output frequency is obtained by multiplying ADSUB by COEF. For example, when a frequency is changed significantly (when adjustment is roughly performed), COEF is set to a large value (for example, 128). When a frequency is not significantly changed (when adjustment is finely performed), COEF is set to a small value (for example, 1). Meanwhile, ADSUB and COEF correspond to frequency setting data according to the invention. Here, ADSUB corresponds to first setting data according to the invention, and COEF corresponds to second setting data according to the invention.

A master sets COEF in advance and adjusts an output frequency by designating ADSUB. In other words, in a stage where adjustment is roughly performed, COEF is set to a large value and ADSUB is changed depending on the amount of adjustment. In a stage where adjustment is finely performed, COEF is set to a small value and ADSUB is changed depending on the amount of adjustment. In other words, the master outputs ADSUB, instead of the parameters ($N_{INT}$, $N_{FRAC}$, ODIV) of the first and second embodiments. Meanwhile, the master may change COEF when necessary. In addition, the master also outputs NEWF. However, NEWF is the same as that in the first embodiment, and thus the description thereof will not be given here.

A storage unit 223 includes registers (COEF, ADSUB, NEWF) with the same name which store COEF, ADSUB, and NEWF, respectively. Values of the registers COEF and ADSUB are used in a computation unit 224.

The computation unit 224 includes a multiplying unit 230, an addition unit 231, and a parameter calculation unit 232. The multiplying unit 230 calculates a difference (hereinafter, referred to as a differential value) between a new output frequency and a current output frequency by multiplying the values of the registers COEF and ADSUB together. Here, COEF of this embodiment is a value of an exponential portion of a power of 2 and determines the amount of shift of ADSUB. Accordingly, the multiplying unit 230 may be a multiplier, but can be realized by a bit shifter when COEF is limited to an exponent of a power of 2. At this time, it is possible to suppress an increase in the circuit size of the multiplying unit 230 as compared with a case where a multiplier is used, and thus the small-sized oscillation circuit 12 can be realized.

The addition unit 231 calculates a new output frequency from the values of the current registers $N_{INT}$, $N_{FRAC}$, and ODIV and the differential value calculated by the multiplying unit 230. The addition unit 231 may be configured to include, for example, an adder. The parameter calculation unit 232 calculates parameters ($N_{INT}$, $N_{FRAC}$, ODIV) which realize the new output frequency. When "1" is written in the register NEWF in the same manner as in the first embodiment, the registers $N_{INT}$, $N_{FRAC}$, and ODIV receive the parameters ($N_{INT}$, $N_{FRAC}$, ODIV), which realize the new output frequency, from the parameter calculation unit 232, respectively, and thus the frequency of an oscillation signal 124 is changed.

FIG. 8 is a diagram showing a register map of the oscillation circuit 12 according to this embodiment. Meanwhile, the same components as those in FIGS. 2, 5, and 18 are denoted by the same reference numerals and signs, and thus the description thereof will not be given here. In the oscillation circuit 12 according to this embodiment, a register COEF is allocated to a register name "Freq10" having an address of 10. A register ADSUB is allocated to a register name "Freq11" having an address of 14. A register NEWF is allocated to bit2 of a register name "SysCtrl" having an address of 15 in the same manner as in the first embodiment.

Here, as described above, COEF has a value which does not frequently change. For example, COEF is set to 128 in a stage where adjustment is roughly performed and is set to 1 in a stage where adjustment is finely performed. For this reason, as in this embodiment, the addresses of "Freq10" and "Freq11" may not be continuous with each other. Meanwhile, as another embodiment, the address of "Freq10" may be set to 13 to be continuous with "Freq11".

Figure 9:
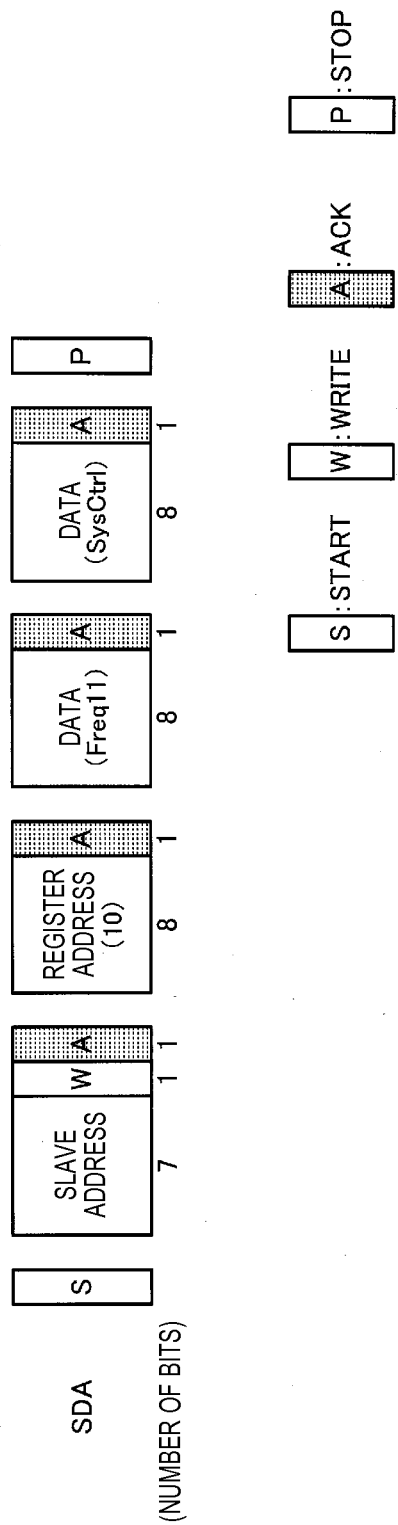
FIG. 9 is a diagram illustrating a procedure of communication with the oscillation circuit according to the third embodiment.

FIG. 9 is a diagram showing a procedure of communication with the oscillation circuit 12 according to this embodiment. Meanwhile, the same components as those in FIGS. 3, 6, and 19 are denoted by the same reference numerals and signs, and thus the description thereof will not be given here. The data (Freq00) are output to the data (Freq04) in the first embodiment, while only the data (Freq11) is output in the oscillation circuit 12 according to this embodiment. For this reason, the amount of transfer of data is reduced as compared with the first embodiment, and thus it is possible to shorten a communication time necessary for a change in output frequency. Accordingly, it is possible to further increase the modulation bandwidth in the oscillation circuit 12 according to this embodiment.

1.4. Fourth Embodiment

Figure 10:
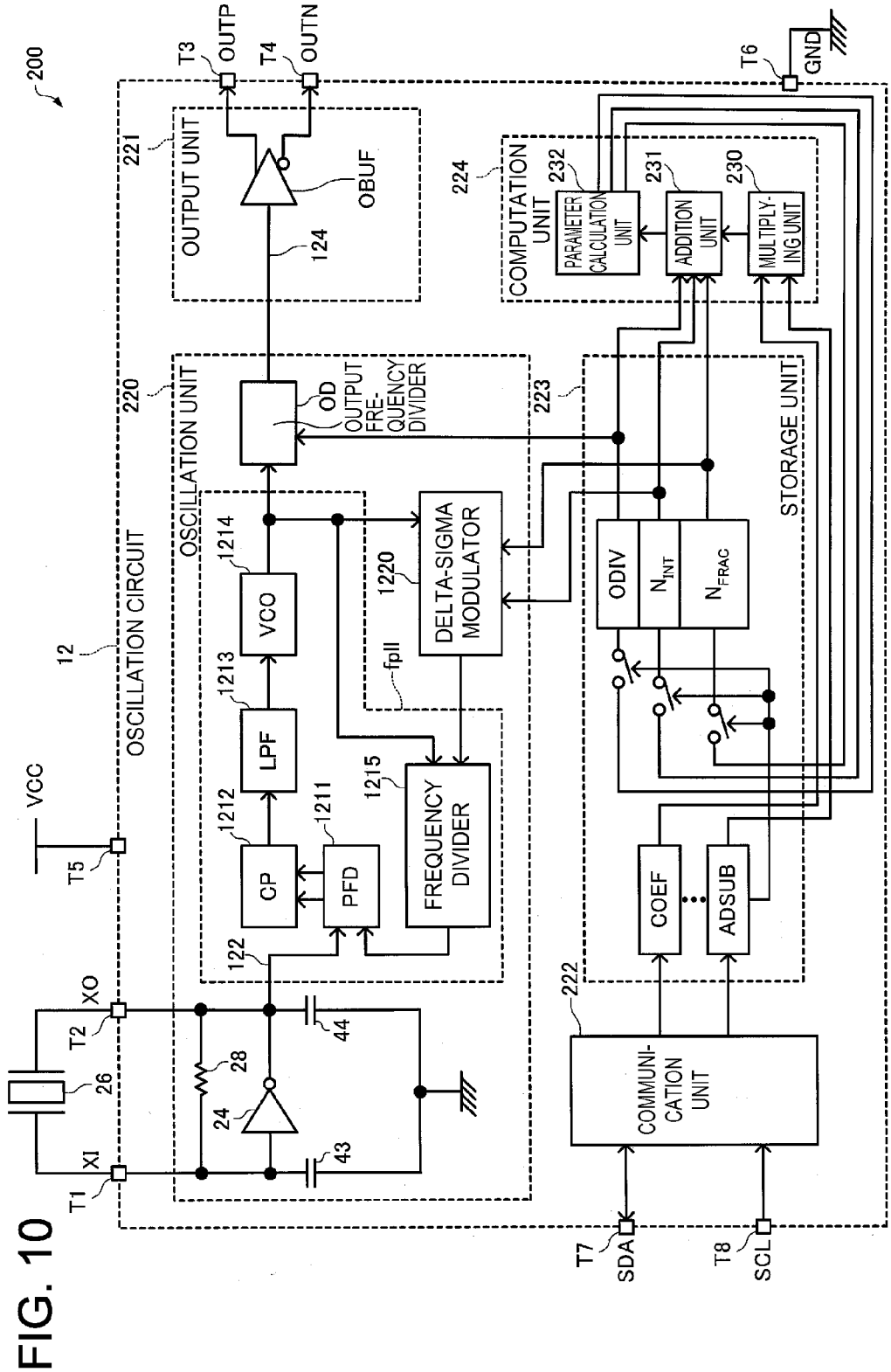
FIG. 10 is a block diagram of an oscillator including an oscillation circuit according to a fourth embodiment.

FIG. 10 is a block diagram of an oscillator 200 including an oscillation circuit 12 according to a fourth embodiment.

The same components as those in FIGS. 1, 4, and 7 are denoted by the same reference numerals and signs, and thus the description thereof will not be given here. Unlike the oscillation circuit 12 according to the third embodiment, the oscillation circuit 12 according to this embodiment adjusts a timing at which an output frequency is changed, regardless of NEWF, and thus a storage unit 223 does not include a register NEWF. In addition, a master is not required to transmit NEWF, and thus it is possible to reduce the amount of transfer of data further than that of the oscillation circuit 12 according to the third embodiment. Accordingly, it is possible to further increase the modulation bandwidth in the oscillation circuit 12 according to this embodiment.

In the oscillation circuit 12 according to this embodiment, when ADSUB[7:0] is written in a register "Freq11" of an address 14 (corresponding to a predetermined address according to the invention), a new parameter calculated by a computation unit 224 is written in each of registers $N_{INT}$, $N_{FRAC}$, and ODIV, and an output frequency having these parameters reflected therein is obtained.

In the oscillation circuit 12 according to this embodiment, the register "Freq11" doubles as the register NEWF in the third embodiment. Accordingly, it is possible to further reduce the amount of transfer of data and to increase the modulation bandwidth further than that of the oscillation circuit 12 according to the third embodiment.

FIG. 11 is a diagram showing a register map of the oscillation circuit 12 according to this embodiment. Meanwhile, the same components as those in FIGS. 2, 5, 8, and 18 are denoted by the same reference numerals and signs, and thus the description thereof will not be given here. Unlike the oscillation circuit 12 according to the third embodiment, the oscillation circuit 12 according to this embodiment does not include a register NEWF. As described above, "Freq11" doubles as the register NEWF in the third embodiment.

Figure 12:
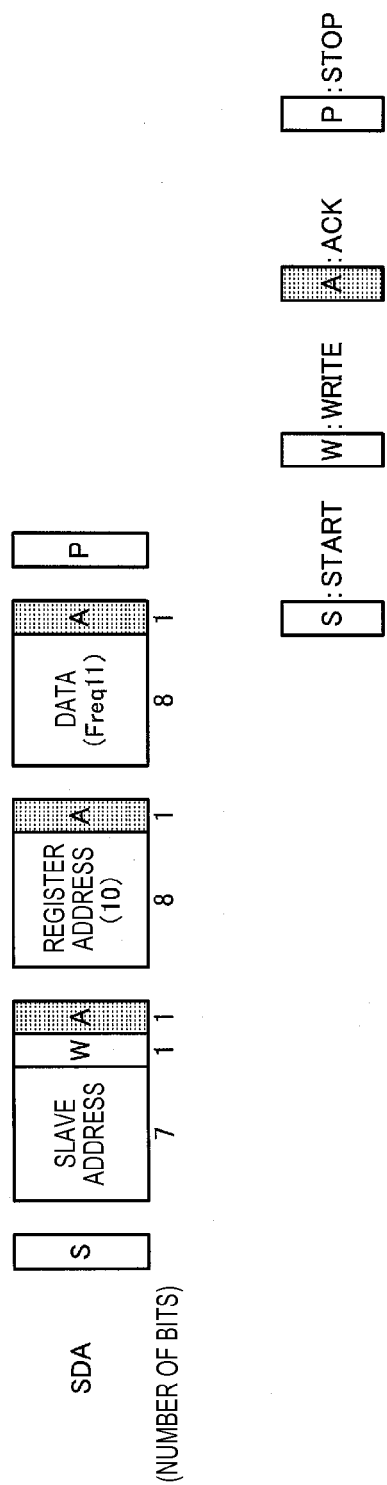
FIG. 12 is a diagram illustrating a procedure of communication with the oscillation circuit according to the fourth embodiment.

FIG. 12 is a diagram showing a procedure of communication with the oscillation circuit 12 according to this embodiment. Meanwhile, the same components as those in FIGS. 3, 6, 9, and 19 are denoted by the same reference numerals and signs, and thus the description thereof will not be given here. As shown in FIG. 12, in the oscillation circuit 12 according to this embodiment, a master does not output "data (SysCtrl)" as compared with the third embodiment. Thus, the amount of transfer of data is further reduced, which allows a communication time necessary for a change in output frequency to be shortened. Accordingly, it is possible to further increase the modulation bandwidth in the oscillation circuit 12 according to this embodiment.

2. Electronic Device

An electronic device 300 according to this embodiment will be described below with reference to FIGS. 13 to 16. Meanwhile, the same components as those in FIGS. 1 to 12, 18, and 19 are denoted by the same reference numerals and signs, and thus the description thereof will not be given here.

Figure 13:
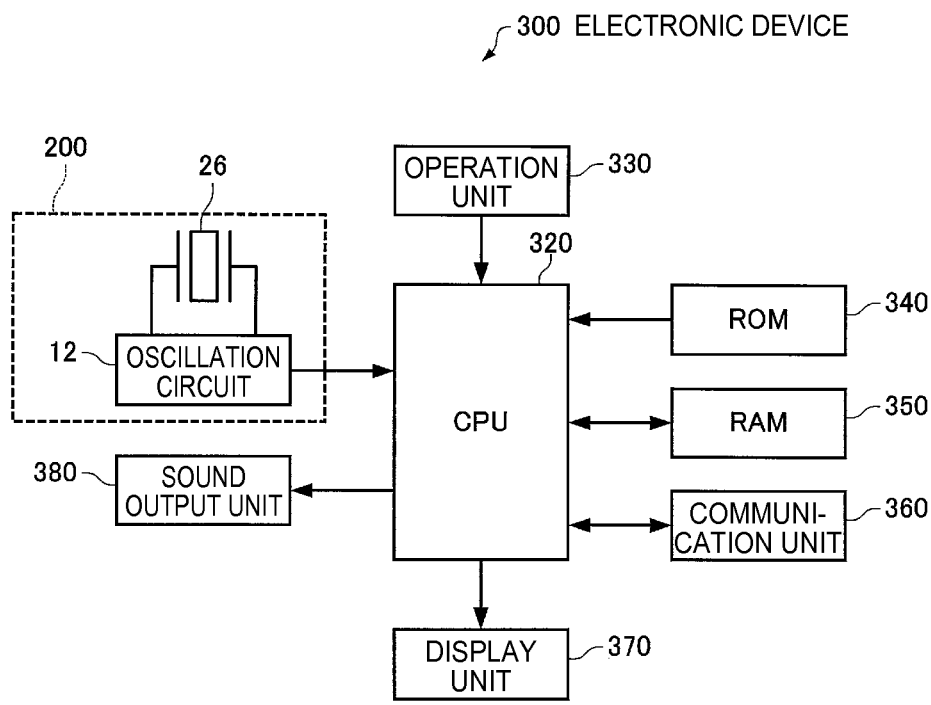
FIG. 13 is a functional block diagram of an electronic device.

FIG. 13 is a functional block diagram of the electronic device 300. The electronic device 300 is configured to include an oscillator 200 including an oscillation circuit 12 and a quartz crystal resonator 26, a central processing unit (CPU) 320, an operation unit 330, a read only memory (ROM) 340, a random access memory (RAM) 350, a communication unit 360, a display unit 370, and a sound output unit 380. Meanwhile, the electronic device 300 may have a configuration in which some of components (respective units) of FIG. 13 are omitted or changed, or may have a configuration in which other components are added.

The oscillator 200 supplies a clock pulse not only to the CPU 320 but also to the respective units (not shown). Meanwhile, the oscillator 200 may be configured such that the oscillation circuit 12 and the quartz crystal resonator 26 are integrally packaged.

The CPU 320 performs various types of calculation processes and control processes using the clock pulse which is output by the oscillation circuit 12, in accordance with a program stored in the ROM 340 or the like. Specifically, the CPU 320 performs various types of processes in response to an operation signal from the operation unit 330, a process of controlling the communication unit 360 in order to perform data communication with the outside, a process of transmitting a display signal for causing the display unit 370 to display various pieces of information, a process of causing the sound output unit 380 to output various types of sounds, and the like.

The operation unit 330 is an input device constituted by operation keys, button switches or the like, and outputs an operation signal to the CPU 320 in response to a user's operation.

The ROM 340 stores programs, data, or the like for causing the CPU 320 to perform various types of calculation processes and control processes.

The RAM 350 is used as a work area of the CPU 320, and temporarily stores programs and data which are read out from the ROM 340, data which is input from the operation unit 330, computation results executed by the CPU 320 in accordance with various types of programs, and the like.

The communication unit 360 performs a variety of controls for establishing data communication between the CPU 320 and an external device.

The display unit 370 is a display device constituted by a liquid crystal display (LCD) or the like, and displays various pieces of information on the basis of a display signal which is input from the CPU 320.

The sound output unit 380 is a device that outputs the sound of a speaker or the like.

As described above, the oscillation circuit 12 included in the oscillator 200 can adjust an output frequency in a modulation bandwidth with a high level of accuracy and can adjust a timing at which the output frequency is changed. For this reason, it is possible to realize the electronic device 300 capable of immediately obtaining a desired frequency.

As the electronic device 300, various electronic devices are considered for use. For example, the electronic device includes a personal computer (for example, mobile-type personal computer, laptop personal computer, or tablet personal computer), a mobile terminal such as a cellular phone, a digital still camera, an ink jet ejecting apparatus (for example, ink jet printer), a storage area network device such as a router or a switch, a local area network device, a device for a mobile terminal base station, a television, a video camera, a video recorder, a car navigation device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), a flight simulator, a head mounted display, a motion tracer, a motion tracker, a motion controller, PDR (walker position and direction measurement), a jitter cleaner, and the like.

Figure 14:
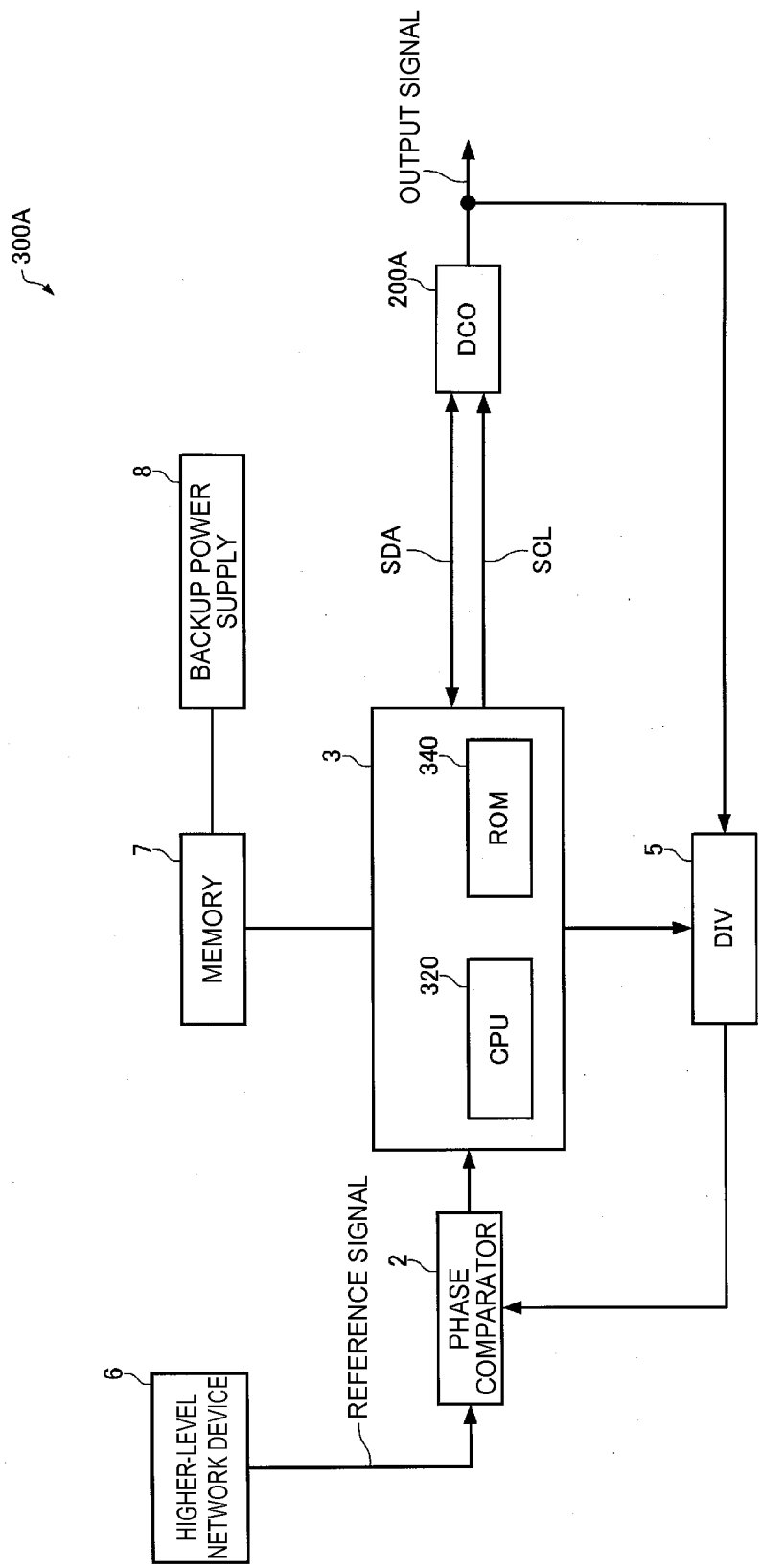
FIG. 14 is a block diagram of a jitter cleaner which is an example of an electronic device.

FIG. 14 is a block diagram of a jitter cleaner 300A which is an example of the electronic device 300. Meanwhile, the same components as those in FIG. 13 are denoted by the same reference numerals and signs, and thus the description thereof will not be given here. The jitter cleaner 300A generates a clock (output signal of FIG. 14) which synchronizes completely with a reference signal. As shown in FIG. 14, the jitter cleaner 300A includes a digital controlled oscillator (DCO 200A of FIG. 14), a phase comparator 2, a controller 3, and a frequency divider (DIV 5 of FIG. 14). In addition, as shown in the example of FIG. 14, the jitter cleaner 300A may include a higher-level network device 6, a memory 7, and a backup power supply 8. The DCO 200A corresponds to the oscillator 200 including the oscillation circuit 12 and the oscillation element which are described above.

The phase comparator 2 detects a phase difference or a frequency difference between an output signal of the DCO 200A and a reference signal and outputs the detected difference as a digital signal. For example, the jitter cleaner 300A obtains a reference signal of a higher-level network, and may be used as a device constituting network synchronization.

The controller 3 generates the parameters that adjust the frequency of an output signal on the basis of the output signal of the phase comparator 2. The controller 3 outputs the generated parameters (for example, $N_{INT}$, $N_{FRAC}$, ODIV) to the DCO 200A by using a serial clock SCL and the serial data SDA.

The controller 3 may include the CPU 320 and the ROM 340 in which a program executed by the CPU 320 is recorded. The CPU 320 may store control voltage data and parameters in the memory 7 by operating in accordance with the program, in addition to performing a process of generating the control voltage data and the parameters, and may perform a process of reading the control voltage data and the parameters which are stored in the memory 7 during the startup thereof, the restoration of a power supply, and the like.

The DIV 5 divides a frequency of the output signal which is output from the DCO 200A and which is input to the phase comparator 2. The higher-level network device 6 receives a signal from a network and outputs a reference signal to the phase comparator 2. The memory 7 is connected to the controller 3, and may be constituted by an SRAM on which rewriting can be performed as needed. The backup power supply 8 is a power supply which is provided so as to prevent data stored in the memory 7 from being lost.

Figure 15:
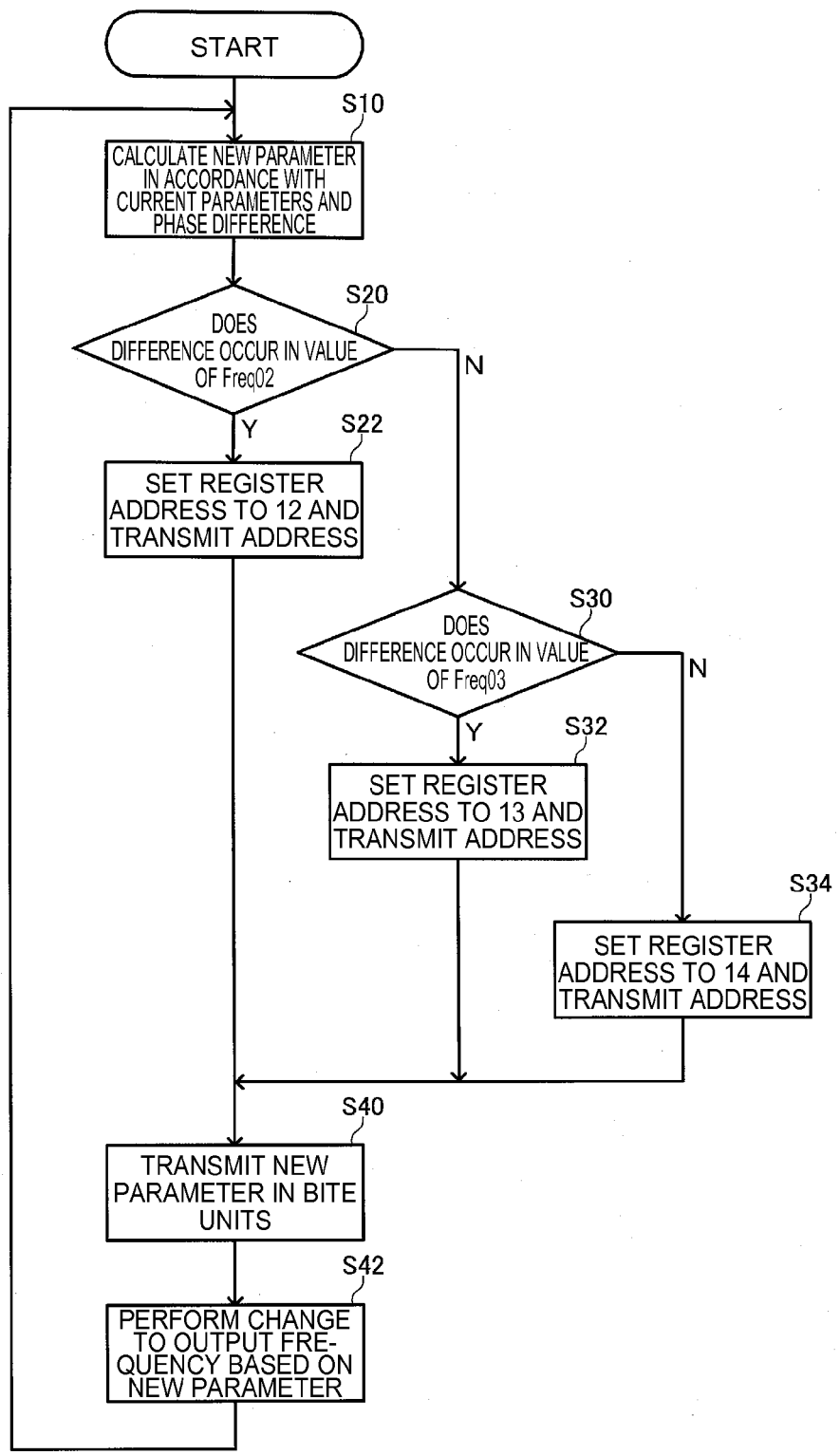
FIG. 15 is a flow chart of serial communication performed by a CPU of an electronic device.

FIG. 15 is a flow chart illustrating an example of serial communication performed by the CPU 320. Here, it is assumed that the DCO 200A includes the oscillation circuit 12 according to the first embodiment. In addition, a case is assumed where the CPU 320 changes $N_{FRAC}$, which is a parameter for adjusting the decimal portion of Expression (2), in order to adjust the frequency of the output signal of the DCO 200A. In other words, it is assumed that $N_{INT}$ and ODIV are not changed. However, even in this case, $N_{FRAC}$ has a larger number of bits than a transfer unit, and thus the CPU 320 is required to control a modulation bandwidth to be increased by reducing unnecessary transfer for as long as possible.

The CPU 320 calculates a new parameter in accordance with the current parameters ($N_{INT}$, $N_{FRAC}$, ODIV) and the phase difference from the phase comparator 2 (S10). Here, it is assumed that $N_{FRAC}$ is the only parameter which is changed by the CPU 320. The CPU 320 determines the presence or absence of a change for each transfer unit (8 bits), that is, for each register in which $N_{FRAC}$ is stored, with respect to the new $N_{FRAC}$. Meanwhile, the CPU 320 performs determination in ascending order of the address of a register.

First, the CPU 320 determines whether a difference occurs in the value of $N_{FRAC}[23:16]$ which is stored in a register "Freq02" (see FIG. 2) (S20). When a difference occurs in the value of $N_{FRAC}[23:16]$ (S20Y), the CPU 320 sets the register address (see FIG. 3) to 12 and transmits the address (S22), and then proceeds to step S40.

When a difference does not occur in the value of $N_{FRAC}[23:16]$, that is, when a change in the register "Freq02" is not necessary (S20N), the CPU 320 determines whether a difference occurs in the value of $N_{FRAC}[15:8]$ which is stored in a register "Freq03" (see FIG. 2) (S30). When a difference occurs in the value of $N_{FRAC}[15:8]$ (S30Y), the CPU 320 sets the register address to 13 and transmits the address (S32), and then proceeds to step S40.

When a difference does not occur in the value of $N_{FRAC}[15:8]$, that is, when a change in the register "Freq03" is not necessary (S30N), the CPU sets the register address to 14 and transmits the address (S34), and then proceeds to step S40. The CPU 320 can reduce unnecessary transfer by performing a branching process, and thus it is possible to increase the modulation bandwidth.

The CPU 320 transmits a new parameter, that is, new $N_{FRAC}$ in units of bytes (S40). After the new $N_{FRAC}$ is stored in a register $U\_N_{FRAC}$ (see FIG. 1), the CPU 320 changes an output frequency based on the new parameter (new $N_{FRAC}$) (S42). Specifically, the CPU 320 writes "1" in a register NEWF (see FIG. 1). Then, S10 to S42 are repeatedly performed.

Figure 16:
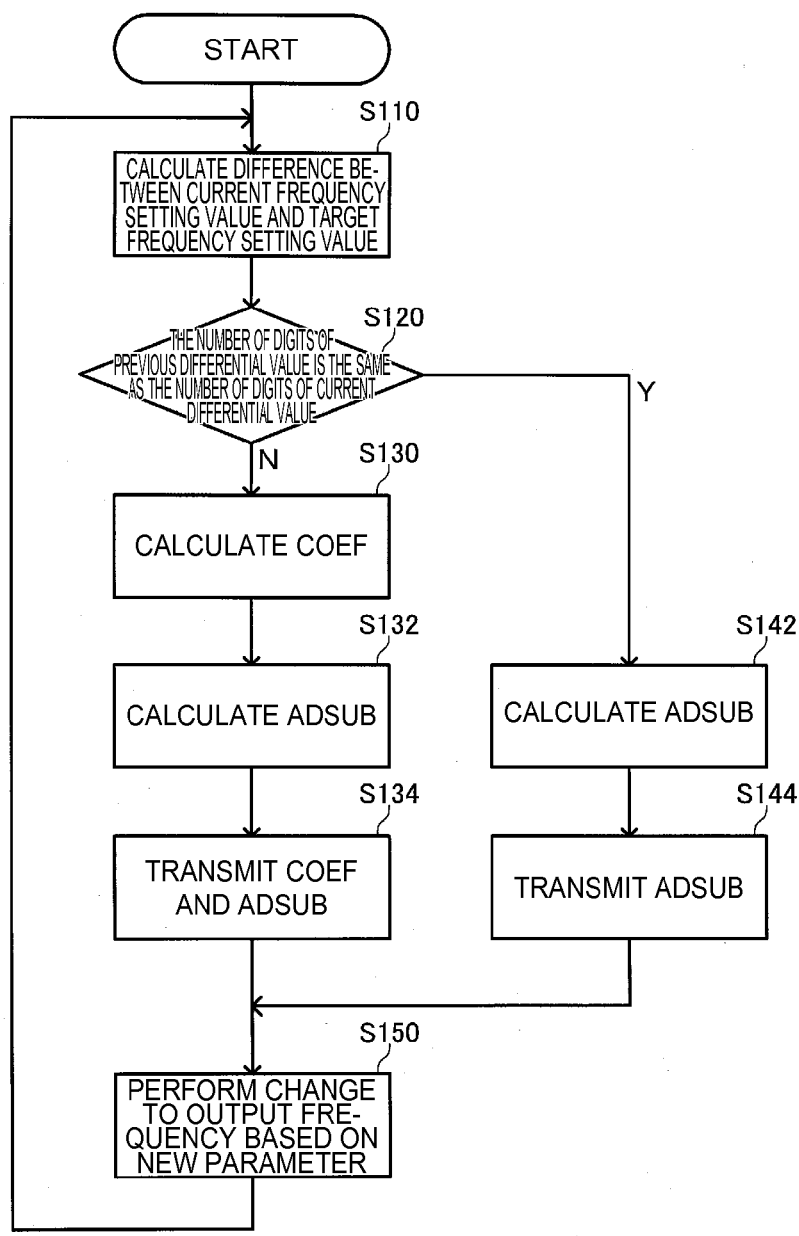
FIG. 16 is a flow chart of another serial communication performed by a CPU of an electronic device.

FIG. 16 is a flow chart illustrating an example of another serial communication performed by the CPU 320. Here, it is assumed that the DCO 200A includes the oscillation circuit 12 according to the third embodiment. The CPU 320 calculates a difference (differential value) between the current output frequency (current frequency setting value) based on the current parameters (COEF and ADSUB) and a desired frequency (target frequency setting value) to be output after adjustment (after a change in parameter) (S110).

Then, the CPU 320 compares a differential value which is calculated this time (hereinafter, current differential value) with, for example, a differential value which was calculated last time and stored in the memory 7 (hereinafter, previous differential value) and determines whether the numbers of digits thereof are the same (S120). Here, COEF designates the coefficient of ADSUB, and the differential value is shown by multiplying COEF by ADSUB. Accordingly, when the number of digits of the previous differential value is the same as the number of digits of the current differential value, the same coefficient can be used, and thus it is not necessary to change the value of COEF.

In other words, when the number of digits of the previous differential value is the same as the number of digits of the current differential value (S120Y), the CPU 320 calculates ADSUB on the basis of the current differential value (S142) and transmits only ADSUB (S144). However, when the number of digits of the previous differential value is not the same as the number of digits of the current differential value (S120N), the CPU 320 calculates COEF on the basis of the current differential value (S130), calculates ADSUB (S132), and transmits COEF and ADSUB (S134).

After step S134 or S144, the CPU 320 changes an output frequency based on a new parameter (S150). Specifically, the CPU 320 writes "1" in a register NEWF (see FIG. 7). Then, S110 to S150 are repeatedly performed.

The oscillation circuit 12 included in the DCO 200A can adjust an output frequency in a high modulation bandwidth with a high level of accuracy and can adjust a timing at which the output frequency is changed. For this reason, the CPU 320 performs control based on the flow charts of FIGS. 15 and 16, and thus it is possible to realize the jitter cleaner 300A capable of immediately obtaining a desired frequency.

3. Moving Object

A moving object 400 according to this embodiment will be described with reference to FIG. 17. FIG. 17 is a diagram (top view) showing an example of the moving object 400 according to this embodiment. The moving object 400 shown in FIG. 17 is configured to include an oscillation circuit 410, controllers 420, 430, and 440 that perform a variety of controls of an engine system, a brake system, a keyless entry system and the like, a battery 450, and a backup battery 460. Meanwhile, the moving object 400 according to this embodiment may have a configuration in which some of the components (respective units) of FIG. 17 are omitted or changed, and may have a configuration in which other components are added.

The oscillation circuit 410 corresponds to the oscillation circuit 12 and is used in connection with the quartz crystal resonator 26 which is not shown in the drawing, but may be replaced with the oscillator 200. The detailed description of other components will not be given, but high reliability is required in order to perform the control required for the movement of the moving object 400. For example, it is possible to enhance reliability by including the backup battery 460 in addition to the battery 450.

A clock pulse which is output by the oscillation circuit 410 is required to be capable of being immediately adjusted to a desired frequency for high reliability. The oscillation circuit 410 can quickly perform adjustment with a high level of accuracy by including the oscillation circuit 12. Accordingly, it is possible to realize the moving object 400 with high reliability.

Various moving objects are considered as such a moving object 400. The moving object includes, for example, an automobile (also including an electric automobile), an aircraft such as a jet engine airplane or a helicopter, a vessel, a rocket, a satellite, and the like.

4. Others

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2013-215623, filed Oct. 16, 2013 is expressly incorporated by reference herein.

What is claimed is:

1. An oscillation circuit that generates an oscillation signal by oscillating an oscillation element, the oscillation circuit comprising:
    a communication unit that receives frequency setting data for setting a frequency of the oscillation signal and frequency change data that provides a timing at which the frequency of the oscillation signal is changed on the basis of the frequency setting data, by serial transfer; and
    registers in which the frequency setting data and the frequency change data received by the communication unit are stored, wherein:
    an address of the register storing the frequency change data is directly next to an address of the register storing the frequency setting data such that the address of the register storing the frequency change data is immediately after the address of the register storing the frequency setting data,
    the frequency setting data includes an integer division data and a fractional division data, and
    the integer division data of the frequency setting data is stored in address N and the fractional division data is stored in address N+1, where N is an integer.

2. The oscillation circuit according to claim 1,
    wherein the communication unit receives the frequency setting data including first setting data and second setting data, and
    wherein a difference between a frequency before the change of the oscillation signal and a frequency after the change thereof is given as a value obtained by multiplying the first setting data by the second setting data.

3. The oscillation circuit according to claim 2, wherein the second setting data is data for determining the amount of shift of the first setting data.

4. An oscillator comprising:
    the oscillation circuit according to claim 1; and
    the oscillation element.

5. An electronic device comprising the oscillation circuit according to claim 1.

6. A moving object comprising the oscillation circuit according to claim 1.

* * * * *